(12) United States Patent
Fu et al.

(10) Patent No.: US 9,615,459 B2
(45) Date of Patent: Apr. 4, 2017

(54) INDUCTOR, CIRCUIT BOARD, AND IMPLEMENTING METHOD OF THE INDUCTOR

(71) Applicant: SHENZHEN CHINA STAR OPTOELECTRONICS TECHNOLOGY CO., LTD., Shenzhen (CN)

(72) Inventors: Jianyong Fu, Shenzhen (CN); Dongsheng Guo, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/416,671

(22) PCT Filed: Dec. 31, 2014

(86) PCT No.: PCT/CN2014/095867
§ 371 (c)(1),
(2) Date: Apr. 20, 2016

(87) PCT Pub. No.: WO2016/095283
PCT Pub. Date: Jun. 23, 2016

(65) Prior Publication Data
US 2016/0242288 A1    Aug. 18, 2016

(30) Foreign Application Priority Data
Dec. 18, 2014  (CN) .......................... 2014 1 0797963

(51) Int. Cl.
*H01F 5/00* (2006.01)
*H05K 1/16* (2006.01)

(52) U.S. Cl.
CPC .................................... *H05K 1/165* (2013.01)

(58) Field of Classification Search
CPC ....................................................... H05K 1/165
(Continued)

(56) References Cited

U.S. PATENT DOCUMENTS

2002/0022110 A1* 2/2002 Barr ....................... H05K 1/115
                                                       428/137
2002/0130737 A1   9/2002 Hreish et al.
(Continued)

FOREIGN PATENT DOCUMENTS

CN     1531841 A     9/2004
CN     1916915 A     2/2007
(Continued)

OTHER PUBLICATIONS

International Search Report (Forms PCT/ISA/220 and PCT/ISA/210) and the Written Opinion (Form PCT/ISA/237) issued on May 28, 2015, by the State Intellectual Property Office of China acting as the International Searching Authority in corresponding International Application No. PCT/CN2014/095867. (12 pages).

*Primary Examiner* — Sherman Ng
(74) *Attorney, Agent, or Firm* — Buchanan Ingersoll & Rooney PC

(57) ABSTRACT

An inductor, a circuit board and a method for forming an inductor are provided. The inductor comprises: a first pad arranged on a first metal wiring layer of a circuit board; a second pad arranged on a second metal wiring layer of the circuit board; and a first hole with conducting medium filled therein, one end of the first hole being located in the first pad and the other end thereof being located in the second pad. The inductor can effectively reduce the area of the circuit occupied by the inductor.

10 Claims, 3 Drawing Sheets

(58) Field of Classification Search
USPC .......................................................... 336/200
See application file for complete search history.

(56) References Cited

U.S. PATENT DOCUMENTS

| | | | |
|---|---|---|---|
| 2007/0074905 A1 | 4/2007 | Lin et al. | |
| 2007/0090912 A1* | 4/2007 | Lee .................... | H01F 17/0013 336/200 |
| 2008/0002380 A1* | 1/2008 | Hazucha ............... | H01L 23/645 361/760 |
| 2013/0271240 A1* | 10/2013 | Liu .................... | H01F 17/0013 333/175 |

FOREIGN PATENT DOCUMENTS

| | | |
|---|---|---|
| CN | 103501577 A | 1/2014 |
| CN | 203536181 U | 4/2014 |
| JP | 2000-040706 A | 2/2000 |

\* cited by examiner

INDUCTOR, CIRCUIT BOARD, AND IMPLEMENTING METHOD OF THE INDUCTOR

CROSS REFERENCE TO RELATED APPLICATION

The present application claims benefit of Chinese patent application CN 201410797963.9, entitled "Inductor, circuit board, and method for forming inductor" and filed on Dec. 18, 2014, which is incorporated herein by reference.

TECHNICAL FIELD

The present disclosure relates to the technical field of power electronic technology, and in particular, to an inductor, a circuit board, and a method for forming an inductor.

TECHNICAL BACKGROUND

In circuit board design, a magnetic bead is indicated by an inductor in terms of circuit symbol, i.e., the magnetic bead is the inductor. Magnetic bead has a small inductance value, is easy to manufacture, and possesses some other characteristics that cannot be achieved in many conventional inductors. For example, a conventional inductor may be equivalent to a capacitance under high frequency (especially high order harmonic) in view of distributed capacitance, so that it cannot function as an inductor.

Figure 1:
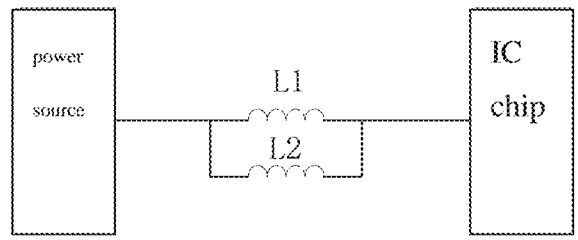

However, the magnetic bead does not have the above-mentioned defects of the conventional inductor. The magnetic bead has excellent high frequency characteristic, and stable inductance characteristic under high frequency. Therefore, as shown in FIG. 1, one or more magnetic beads (for example, a magnetic bead L1 and a magnetic bead L2) will be generally disposed at the locations, such as a power source end or the like, in the circuit design, no as to better remove clutters and restrain noise and pulse disturbance in a power line. However, the utilization of the magnetic beads, although removes the noise, results in an overlarge circuit board, thus increasing the production cost of the circuit board.

SUMMARY OF THE INVENTION

The present disclosure aims to solve the technical problems of overlarge circuit board, high production cost and the like caused by inductors such as magnetic beads used in the prior art. In order to solve the above-mentioned problems, an embodiment of the present disclosure provides an inductor, comprising: a first pad arranged on a first metal wiring layer of a circuit board; a second pad arranged on a second metal wiring layer of the circuit board; and a first hole with conducting medium filled therein, one end of the first hole being located in the first pad and the other end thereof being located in the second pad.

According to an embodiment of the present disclosure, the first metal wiring layer and/or the second metal wiring layer are superficial metal wiring layers of the circuit board.

According to an embodiment of the present disclosure, the inductor further comprises: a third pad arranged on a third metal wiring layer of the circuit board; a fourth pad arranged on a fourth metal wiring layer of the circuit board; and a second hole with conducting medium filled therein, one end of the second hole being located in the third pad and the other end thereof being located in the fourth pad.

According to an embodiment of the present disclosure, the fourth metal wiring layer and the second metal wiring layer are at the same level, and the fourth pad is connected with the second pad through metal wirings.

According to an embodiment of the present disclosure, the third metal wiring layer and the first metal wiring layer are at the same level, and the third pad is connected with the first pad through metal wirings.

According to an embodiment of the present disclosure, the conducting medium is copper, gold, silver, or tin.

The present disclosure further provides a circuit board, comprising the above-mentioned inductor.

The present disclosure further provides a method for forming an inductance, wherein a required inductor is formed by corresponding via hole(s) in a circuit board.

According to an embodiment of the present disclosure, the inductor is formed by a plurality of via holes in the circuit board that are in series or parallel connection.

According to an embodiment of the present disclosure, a required inductance value of the inductor is obtained by adjusting the length of the via hole.

In a conventional circuit board, the parasitic inductance of the via hole, which is considered as a kind of stray inductance, should be reduced as much as possible in the design of the via hole, so that the influence of the parasitic inductance of the via hole on the circuit can be reduced. By contrast, in the inductor according to the present disclosure, the parasitic inductance of the via hole can be utilized purposely, so that the problem of enhanced difficulty in circuit design caused by the necessity of reducing the parasitic inductance of the via hole can be effectively solved. In the meantime, the area of the circuit board occupied by the inductor can be also effectively reduced, thus the whole area and the production cost of the circuit board can be both decreased.

In circuit design, the thickness of the circuit board is constant. That is, the thickness of the circuit board is fixed after the number of layers and relevant parameters of the circuit board are determined. For a certain circuit board, since the thickness is fixed, the minimum diameter of the hole arranged in the circuit board is also relatively fixed. This is because the ratio of the diameter of the hole to the thickness of the circuit board cannot be less than a certain value due to processing requirement. Therefore, the maximum inductance value of the hole is relatively fixed. However, for different circuits, the inductance value required by the inductor in the circuits may exceed the maximum inductance value of the hole. Therefore, in order to solve this problem, the present disclosure further provides an inductor formed by a plurality of via holes that are in series connection. The inductor has a relatively large inductance value, so that the restriction of the thickness of the circuit board on the inductance value can be overcome. Thus the inductor according to the present disclosure can be used in various applications.

The maximum inductance value of the hole in the circuit board, i.e., the inductance value of a through hole, is relatively fixed. Thus, for some circuits which require a small inductance value, the required inductance value can be obtained by reducing the length of the hole (i.e., adopting a buried hole or a blind hole). However, in the process of production of circuit boards, the production difficulty and cost of the buried hole or the blind hole are significantly higher than those of the through hole. Therefore, in order to solve this problem, the present disclosure further provides an inductor with a smaller inductance value, which is formed by a plurality of via holes that are in parallel connection.

Thus the process difficulty and cost of the circuit board can be effectively reduced, which would be beneficial to the cost and quality control for the producer.

Other features and advantages of the present disclosure will be further explained in the following description, and partially become more readily evident therefrom, or can be understood through implementing the present disclosure. The objectives and advantages of the present disclosure will be achieved through the structures specifically pointed out in the description, claims, and the accompanying drawings.

BRIEF DESCRIPTION OF THE
ACCOMPANYING DRAWINGS

In order to illustrate the technical solutions of the embodiments of the present disclosure or the technical solutions in the prior art more clearly, the accompanying drawing needed for explaining the embodiments or the prior art will be explained briefly as follows.

FIG. 1 schematically shows a conventional circuit comprising a magnetic bead for connection.

Figure 2:
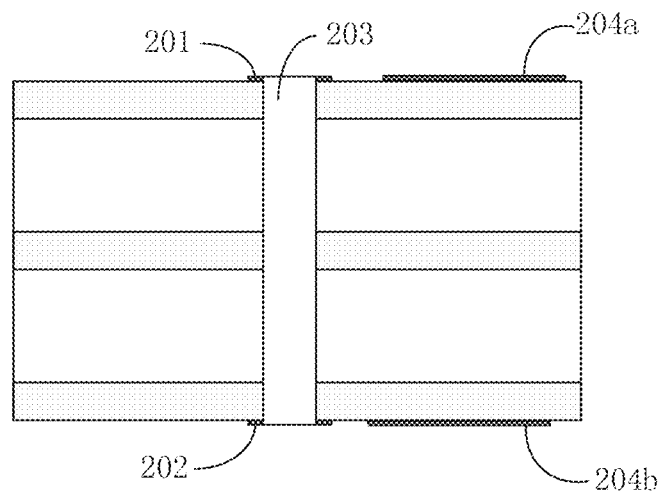

FIG. 2 schematically shows the structure of an inductor according to an embodiment of the present disclosure.

Figure 3:
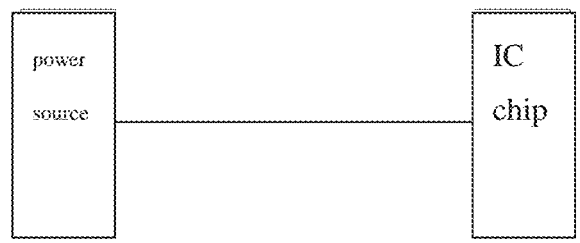

FIG. 3 schematically shows a circuit comprising an inductor according to an embodiment of the present disclosure for connection.

Figure 4:
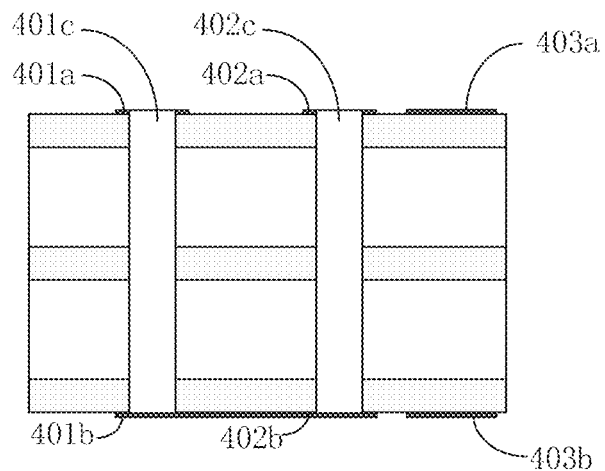

FIG. 4 schematically shows the structure of an inductor according to another embodiment of the present disclosure.

Figure 5:
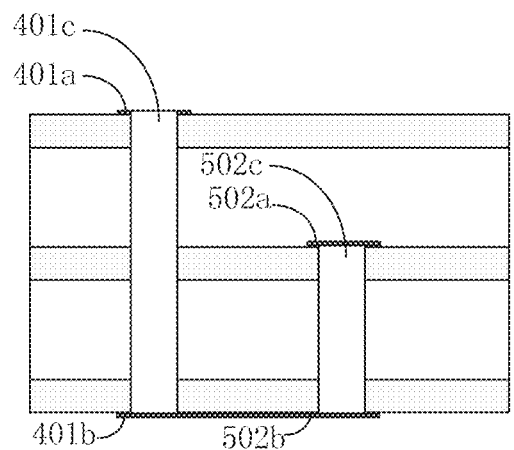

FIG. 5 schematically shows the structure of an inductor according to a further embodiment of the present disclosure.

Figure 6:
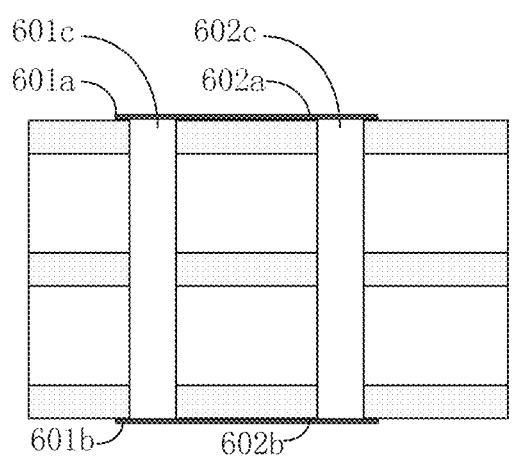

FIG. 6 schematically shows the structure of an inductor according to a still further embodiment of the present disclosure.

DETAILED DESCRIPTION OF THE
EMBODIMENTS

The present disclosure will be explained in detail with reference to the embodiments and the accompanying drawings, whereby it can be fully understood about how to solve the technical problem by the technical means according to the present disclosure and achieve the technical effects thereof, and thus the technical solution according to the present disclosure can be implemented. It is important to note that as long as there is no structural conflict, various embodiments as well as the respective technical features mentioned herein may be combined with one another in any manner, and the technical solutions obtained all fall within the scope of the present disclosure.

Meanwhile, in the following descriptions, numerous details are explained for illustration, so that the embodiments of the present disclosure can be understood thoroughly. It is obvious for the person skilled in the art that the present disclosure can be implemented without the details or the specific method described herein.

Embodiment 1

FIG. 2 schematically shows the structure of an inductor provided by embodiment 1.

As shown in FIG. 2, the inductor provided by the embodiment comprises a first pad 201, a second pad 202 and a first hole 203, wherein the first pad 201 is arranged on a first metal wiring layer 204a of a circuit board, and the second pad 202 is arranged on a second metal wiring layer 204b of the circuit board. One end of the first hole 203 is located in the first pad 201, while the other end thereof is located in the second pad 202. Meanwhile, conducting medium is filled in the first hole 203 to enable the first hole conductive.

Specifically, in the embodiment, a homogeneous and heat-shock-resistant layer of metallic copper is applied over the wall of the hole through metallization treatment. In particular, the metallization treatment comprises steps of desmear, chemical deposition with copper, copper intensification, and the like.

It is important to note that in other embodiments of the present disclosure, other suitable methods can be also adopted to enable the first hole possess a good conductivity. Meanwhile, the conductive medium filled in the first hole can be other suitable conductive materials, for example, gold, silver, or tin and the like. The present disclosure is not restricted in this regard.

As shown in FIG. 2, in the embodiment, the first metal wiring layer 204a and the second metal wiring layer 204b are both superficial metal wiring layers of the circuit board, thus the first hole 203 becomes a through hole passing through the circuit board. Naturally, in other embodiments of the present disclosure, the first metal wiring layer and/or the second metal wiring layer can be also located on other layers of the circuit board, thus enabling the first hole a buried hole or a blind hole in the circuit board. The present disclosure is not restricted in this regard.

For the first hole 203, the inductance value L thereof can be calculated by the following expression:

$$L = 5.08 \cdot h \cdot \left[ \ln\left(\frac{4h}{d}\right) + 1 \right], \quad (1)$$

wherein h represents for the length of the first hole (i.e., the thickness of the circuit board in the embodiment), and d represents for the diameter of the first hole.

For a circuit board X having a thickness of 0.04 inches and a first hole therein with a diameter of 0.01 inches, the inductance value of the first hole is 0.77 nH through expression (1).

It can be seen from expression (1) that the inductance value L of the hole is associated with the length h and the diameter d of the hole. However, the variation of the diameter d has less influence on the inductance value L. Therefore, in a different embodiment of the present disclosure, the required inductance value can be obtained by appropriate adjustment of the length of the hole (for example, adjusting the metal wiring layers where two ends of the hole are located). Naturally, in other embodiments of the present disclosure, the required inductance value of the hole can be obtained by other suitable methods. The present disclosure is not restricted in this regard.

FIG. 3 schematically shows a circuit comprising the inductor provided by the embodiment for connection. It can be seen from a comparison between FIG. 1 and FIG. 3 that the inductor provided by the embodiment is achieved by a via hole in the circuit board, thus the phenomenon that much area in the circuit board is occupied in a manner similar to the magnetic bead would not occur.

The via hole is one of important components of the circuit board. However, the via hole has a parasitic inductance, which is more harmful than a parasitic capacitance in a high-speed digital circuit. In some filter circuits, the parasitic inductance of the via hole would weaken the effect of a bypass capacitor, thus reducing the filtering effect of the whole filter circuit.

It can be seen that in a conventional circuit board, the parasitic inductance of the via hole, which is considered as a kind of stray inductance, should be reduced as much as possible in the design of the via hole, so that the influence of the parasitic inductance of the via hole on the circuit can be reduced. By contrast, in the inductor according to the present disclosure, the parasitic inductance of the via hole can be utilized purposely, so that the problem of enhanced difficulty in circuit design caused by the necessity of reducing the parasitic inductance of the via hole can be effectively solved. In the meantime, the area of the circuit board occupied by the inductor can be also effectively reduced, thus the whole area and the production cost of the circuit board can be both decreased.

Embodiment 2

In circuit design, the thickness of the circuit board is constant. That is, the thickness of the circuit board is fixed after the number of layers and relevant parameters of the circuit board are determined. For a certain circuit board, since the thickness is fixed, the minimum diameter of the hole arranged on the circuit board is also relatively fixed. This is because the ratio of the diameter of the hole to the thickness of the circuit board cannot be less than a certain value due to processing requirement. Therefore, according to expression (1), the maximum inductance value of the hole is relatively fixed.

However, for different circuits, the inductance value required by the inductor in the circuits may exceed the maximum inductance value of the hole. Embodiment 2 provides a novel inductor in order to solve the problem. FIG. 4 schematically shows the structure of an inductor provided by the embodiment.

As shown in FIG. 4, the inductor provided by the embodiment comprises a first pad 401*a*, a second pad 401*b*, a first hole 401*c*, a third pad 402*a*, a fourth pad 402*b* and a second hole 402*c*, wherein the first pad 401*a* and the third pad 402*a* are located on a first metal wiring layer and a third metal wiring layer respectively, while the second pad 401*b* and the fourth pad 402*b* are located on a second metal wiring layer and a fourth metal wiring layer respectively. In the embodiment, the first metal wiring layer and the third metal wiring layer are in the same level, while the second metal wiring layer and the fourth metal wiring layer are also in the same level.

One end of the first hole 401*c* is located in the first pad, while the other end is located in the second pad. One end of the second hole 402*c* is located in the third pad, while the other end is located in the fourth pad. Conducting medium (for example, copper, gold, silver, or tin, and the like) is filled in both of the first hole and the second hole to ensure the conductivity of both holes.

In the embodiment, the second pad 401*b* is connected with the fourth pad 402*b* through metal wirings to enable the inductor possess a greater inductance value. Thus the final inductance value of the inductor equals to the sum of the inductance values of the first hole and the second hole. Therefore, the restriction of the thickness of the circuit board on the inductance value of the hole is overcome, thus the inductor provided by the embodiment can be used in various applications.

Naturally, in other embodiments of the present disclosure, the metal wiring layers where the above-mentioned four pads are located can be not only superficial metal wirings layers, but also intermediate metal wiring layers of the circuit board. That is, the first and/or the second hole can be a through hole, a blind hole or a buried hole. The present disclosure is not restricted in this regard. For example, FIG. 5 schematically shows the structure of an inductor. Compared with the inductor shown in FIG. 4, the third pad 502*a* of the inductor shown in FIG. 5 is located in the intermediate metal wiring layer, while the fourth pad thereof is still located in the superficial metal wiring layer. In this way, the inductor shown in FIG. 5 can be considered as an inductor formed by a through hole and a blind hole in series connection.

In addition, in other embodiments of the present disclosure, in order to obtain a required inductance value, an inductor with a larger inductance value can be obtained by more than three holes in series connection on basis of the same principle. The present disclosure is not restricted in this regard.

It can be seen from the above that similar to the inductor provided by embodiment 1, in the inductor provided in embodiment 2, the via hole in the circuit board is also used to replace an inductor, such as a magnetic bead, in a conventional circuit board. However, in the inductor provided by the embodiment, a plurality of via holes are in series connection to obtain a larger inductance value, thus the restriction of the thickness of the circuit board on the inductance value of the via hole can be overcome. Thus the inductor provided by embodiment can be used in various applications.

Embodiment 3

It can be known from embodiment 2 that the maximum inductance value of the hole in the circuit board, i.e., the inductance value of a through hole, is relatively fixed. Thus, for some circuits which require a small inductance value, the required inductance value can be obtained by reducing the length of the hole (i.e., adopting a buried hole or a blind hole). However, in the production process of circuit boards, the production difficulty and cost of the buried hole or blind hole are significantly higher than those of the through hole. Therefore, in order to solve this problem, embodiment 3 of the present disclosure further provides an inductor as shown in FIG. 6.

As shown in FIG. 6, the inductor provided by the embodiment, similar to the inductor shown in FIG. 4, also comprises two pairs of pads and two holes, wherein a first pad 601*a* is connected with a third pad 602*a* through metal wirings, and a second pad 601*b* is also connected with a fourth pad 602*b* through metal wirings. Thus the first hole 601*c* and the second hole 602*c* can be considered as in parallel connection. Two inductors in parallel connection will have a smaller inductance value. Therefore, the inductor provided by the embodiment can have a smaller inductance value by adopting the through holes. In this way, the restriction of the thickness of the circuit board on the inductance value can be overcome, and the difficulty and cost of the circuit board design and production can be also decreased.

Naturally, in other embodiments of the present disclosure, in order to obtain a required inductance value, an inductor with a small inductance value can be obtained by more than three holes in parallel connection on basis of the same principle. The present disclosure is not restricted in this regard.

It can be seen from the foregoing that an inductor with a small inductance value formed by a plurality of via holes in parallel connection is provided in the embodiment. With the inductor of such structure, the processing difficulty and cost of the circuit board can be effectively reduced, and thus it is beneficial to the cost and quality control for the producer.

Moreover, the present disclosure further provides a circuit board, wherein all or some of the inductors thereof are the inductor provided by any one of the above-mentioned embodiments. In this way, the circuit board is no longer required to provide independent space for accommodation of corresponding inductors. Thus the area of the circuit board is reduced, the difficulty of design the circuit board is low, and the cost of design and production of the circuit board is decreased.

It is to be understood that the embodiments of the present disclosure are not limited to the specific structures, processing steps, or materials provided here, but can be extended to equivalent replacements of these features understood by person ordinarily skilled in the art. It is further to be understood that the terms used here are descriptions for specific embodiments, rather than limitations.

Expressions such as "one embodiment" or "embodiments" in the description means that the specific feature, structure or character according to the embodiments are included in at least one of the embodiments of the present disclosure. Therefore, the phrases "one embodiment" or "embodiments" in the whole description does not always indicate the same embodiment.

A plurality of projects, structural units, constitutional units and/or materials here can show up in common lists for convenience. However, these lists should be explained that each element in the list is considered as a single member. Therefore, without opposite illustrations, none of the members in the list can be explained as a practical equivalent of other members in the same list on basis of their appearance in the same list. Moreover, replacements of each component can be also utilized to refer to every embodiment and example of the present disclosure. It is to be understood that these embodiments, examples and replacements cannot be explained as equivalents of each other, but be considered as independent represents of the present disclosure.

In addition, the features or characters described here can be combined to one or more embodiments in any other appropriate method. In the above descriptions, some specific details, length, inductance value and the like, are provided to provide comprehensive understanding of the embodiments of the present disclosure. However, it is to be understood for any person skilled in the art that the present disclosure can be implemented without one or more specific details mentioned above, or implemented by other methods, components and materials.

Although the above-mentioned examples are utilized to explain the principle of the present disclosure in one or more applications, under the circumstance of not deviating from principle and thought of the present disclosure, person skilled in the art can modify the form, usage and implementation details without creative work. Therefore, the present disclosure is restricted by the accompanying claims.

The invention claimed is:

1. An inductor, comprising: a first pad arranged on a first metal wiring layer of a circuit board; a second pad arranged on a second metal wiring layer of the circuit board; a first hole with conducting medium filled therein, one end of the first hole being located in the first pad and the other end thereof being located in the second pad; a third pad arranged on a third metal wiring layer of the circuit board; a fourth pad arranged on a fourth metal wiring layer of the circuit board; and a second hole with conducting medium filled therein, one end of the second hole being located in the third pad and the other end thereof being located in the fourth pad; wherein the fourth metal wiring layer and the second metal wiring layer are at the same level, and the fourth pad is connected with the second pad through metal wirings; and wherein the third metal wiring layer and the first metal wiring layer are at the same level, and the third pad is connected with the first pad through metal wirings.

2. The inductor according to claim 1, wherein the first metal wiring layer and/or the second metal wiring layer are superficial metal wiring layers of the circuit board.

3. The inductor according to claim 1, wherein the conducting medium is copper, gold, silver, or tin.

4. A circuit board, comprising an inductor, wherein the inductor comprises: a first pad arranged on a first metal wiring layer of a circuit board; a second pad arranged on a second metal wiring layer of the circuit board; a first hole with conducting medium filled therein, one end of the first hole being located in the first pad and the other end thereof being located in the second pad; a third pad arranged on a third metal wiring layer of the circuit board; a fourth pad arranged on a fourth metal wiring layer of the circuit board; and a second hole with conducting medium filled therein, one end of the second hole being located in the third pad and the other end thereof being located in the fourth pad; wherein the fourth metal wiring layer and the second metal wiring layer are at the same level, and the fourth pad is connected with the second pad through metal wirings; and wherein the third metal wiring layer and the first metal wiring layer are at the same level, and the third pad is connected with the first pad through metal wirings.

5. The circuit board according to claim 4, wherein the first metal wiring layer and/or the second metal wiring layer are superficial metal wiring layers of the circuit board.

6. The circuit board according to claim 4, wherein the conducting medium is copper, gold, silver, or tin.

7. A method for forming an inductor, wherein a required inductor is formed by a corresponding via hole in a circuit board, wherein the circuit board comprises the inductor, and the inductor comprises: a first pad arranged on a first metal wiring layer of a circuit board; a second pad arranged on a second metal wiring layer of the circuit board; a first hole with conducting medium filled therein, one end of the first hole being located in the first pad and the other end thereof being located in the second pad; a third pad arranged on a third metal wiring layer of the circuit board; a fourth pad arranged on a fourth metal wiring layer of the circuit board; and a second hole with conducting medium filled therein, one end of the second hole being located in the third pad and the other end thereof being located in the fourth pad: wherein the fourth metal wiring layer and the second metal wiring layer are at the same level, and the fourth pad is connected with the second pad through metal wirings; and wherein the third metal wiring layer and the first metal wiring layer are at the same level, and the third pad is connected with the first pad through metal wirings.

8. The method according to claim 7, wherein the inductor is formed by a plurality of via holes in the circuit board that are in series or parallel connection.

9. The method according to claim 7, wherein a required inductance value of the inductor is obtained by adjusting the length of the via hole.

10. The method according to claim 8, wherein a required inductance value of the inductor is obtained by adjusting the length of the via hole.

* * * * *